US012034271B2

United States Patent
Lex et al.

(10) Patent No.: US 12,034,271 B2
(45) Date of Patent: Jul. 9, 2024

(54) OPTOELECTRONIC SEMICONDUCTOR DEVICE WITH FIRST AND SECOND OPTOELECTRONIC ELEMENTS

(71) Applicant: Osram OLED GmbH, Regensburg (DE)

(72) Inventors: Florian Lex, Barbing (DE); Thomas Kippes, Neumarkt (DE); Michael Mueller, Garching (DE); Fabian Knorr, Postbauer-Heng (DE); Zeljko Pajkic, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 773 days.

(21) Appl. No.: 17/262,238

(22) PCT Filed: Jul. 23, 2019

(86) PCT No.: PCT/EP2019/069812
§ 371 (c)(1),
(2) Date: Jan. 22, 2021

(87) PCT Pub. No.: WO2020/020893
PCT Pub. Date: Jan. 30, 2020

(65) Prior Publication Data
US 2021/0193860 A1    Jun. 24, 2021

(30) Foreign Application Priority Data

Jul. 24, 2018   (DE) ..................... 10 2018 117 907.3
Sep. 28, 2018   (DE) ..................... 10 2018 124 040.6

(51) Int. Cl.
*H01S 5/00*   (2006.01)
*H01S 5/02257*   (2021.01)
(Continued)

(52) U.S. Cl.
CPC ............ *H01S 5/026* (2013.01); *H01S 5/0028* (2013.01); *H01S 5/02257* (2021.01);
(Continued)

(58) Field of Classification Search
CPC .... H01S 5/026; H01S 5/0028; H01S 5/02257; H01S 5/0264; H01S 5/04256; H01S 5/423
See application file for complete search history.

(56) References Cited

U.S. PATENT DOCUMENTS 5,874,730 A * 2/1999 Yi .......................... G11B 7/123
7,393,145 B1 * 7/2008 Stevens ................ G02B 6/4246
                                              250/227.15

(Continued)

FOREIGN PATENT DOCUMENTS

CN   1115466 A   1/1996
CN   1738117 A   2/2006

(Continued)

OTHER PUBLICATIONS

Search Report for the corresponding German Patent Application No. 10 2018 124 040.6 dated Jul. 22, 2019, 8 pages (for reference purposes only).

(Continued)

*Primary Examiner* — Kinam Park
(74) *Attorney, Agent, or Firm* — VIERING, JENTSCHURA & PARTNER mbB (57) ABSTRACT

An optoelectronic semiconductor device may include a first array of first optoelectronic components and a second array of second optoelectronic components arranged in a substrate. The first optoelectronic components may each include a first resonator mirror and a second resonator mirror where the first resonator mirror has a first main surface and an active area suitable for generating radiation. Each resonator (Continued)

mirror is arranged one above the other along a first direction where radiation emitted by the optoelectronic component is emitted via the first main surface. The first optoelectronic components are suitable for emitting electromagnetic radiation. The second optoelectronic components may each include an active area suitable for generating radiation and are suitable for absorbing electromagnetic radiation.

19 Claims, 10 Drawing Sheets

(51) Int. Cl.
*H01S 5/026* (2006.01)
*H01S 5/042* (2006.01)
*H01S 5/42* (2006.01)
H01L 31/0232 (2014.01)
H01L 31/173 (2006.01)

(52) U.S. Cl.
CPC ........ *H01S 5/0264* (2013.01); *H01S 5/04256* (2019.08); *H01S 5/423* (2013.01); *H01L 31/0232* (2013.01); *H01L 31/173* (2013.01); *H01S 5/0071* (2013.01)

(56) References Cited

U.S. PATENT DOCUMENTS

| | | | |
|---|---|---|---|
| 2003/0011888 A1* | 1/2003 | Cox | G02B 6/138 |
| | | | 257/E31.128 |
| 2006/0039434 A1 | 2/2006 | Coleman | |
| 2006/0071150 A1 | 4/2006 | Aizpuru | |
| 2015/0340841 A1* | 11/2015 | Joseph | H01S 5/04257 |
| | | | 372/50.12 |
| 2016/0352071 A1 | 12/2016 | Hogan et al. | |
| 2018/0164409 A1 | 6/2018 | Chen | |
| 2021/0116355 A1* | 4/2021 | Spruit | G01N 15/1431 |

FOREIGN PATENT DOCUMENTS

| | | |
|---|---|---|
| DE | 19508256 A1 | 12/1995 |
| DE | 60123122 T2 | 9/2007 |
| EP | 0805528 A2 | 11/1997 |
| GB | 2289974 A | 12/1995 |
| WO | 02052335 A2 | 7/2002 |
| WO | 2017158004 A1 | 9/2017 |

OTHER PUBLICATIONS

International Search Report for the corresponding European Patent Application No. PCT/EP2019/069812 mailed on Oct. 21, 2019, 3 pages (for reference purposes only).

Chinese Search Report of corresponding Chinese Patent Application No. 2019800492505, dated Jul. 14, 2023, 2 pages (for informational purposes only).

* cited by examiner

OPTOELECTRONIC SEMICONDUCTOR DEVICE WITH FIRST AND SECOND OPTOELECTRONIC ELEMENTS

CROSS-REFERENCE TO RELATED APPLICATIONS

The present application is a national stage entry according to 35 U.S.C. § 371 of PCT application No.: PCT/EP2019/069812 filed on Jul. 23, 2019; which claims priority to German Patent Application Serial No.: 10 2018 117 907.3 filed on Jul. 24, 2018, as well as claims priority to German Patent Application Serial No.: 10 2018 124 040.6 filed on Sep. 28, 2018; all of which are incorporated herein by reference in their entirety and for all purposes.

TECHNICAL FIELD

The present disclosure relates to optoelectronic semiconductor devices having a first resonator mirror and a second resonator mirror.

BACKGROUND

Mobile consumer electronics devices often contain laser light sources. For example, these are implemented as surface-emitting lasers, i.e. lasers in which the generated laser light is emitted via a surface of a semiconductor layer arrangement.

SUMMARY

An optoelectronic semiconductor device includes a first array of first optoelectronic components and a second array of second optoelectronic components which are arranged in a substrate. The first optoelectronic components each include a first resonator mirror with a first main surface, an active area suitable for generating radiation, and a second resonator mirror, each of which is arranged one above the other along a first direction, wherein radiation emitted by the optoelectronic component is emitted via the first main surface. The first optoelectronic components are suitable for emitting electromagnetic radiation. The second optoelectronic components each comprise an active area suitable for generating radiation and are suitable for absorbing electromagnetic radiation.

For example, the first optoelectronic components form surface-emitting laser diodes. The active area of each of the first optoelectronic components may be identical to the active area of each of the second optoelectronic components.

For example, the first array has a larger surface than the second array. The second array may be arranged in a central area within the first array. Alternatively, the second array may also be arranged in an edge area of the first array.

The optoelectronic semiconductor device may further include an optical element which is arranged above the first and above the second arrays of first and second optoelectronic components. For example, the optical element may be an array of microlenses. According to embodiments, the optical element may contain additional deflection elements which are suitable for directing incident radiation onto a predetermined area of the second array.

The optical element may directly adjoin the surface of the optoelectronic components.

For example, the second optoelectronic components may be suitable for detecting electromagnetic radiation emitted by the first optoelectronic components.

For example, the first optoelectronic components may each be electrically connected to one another via at least a portion of the common substrate. According to embodiments, the second optoelectronic components may each be electrically connected to one another via at least a portion of the common substrate.

The optoelectronic semiconductor device may further comprise an insulating element that insulates the first array from the second array.

The first and second optoelectronic components may each contain a first contact area and a second contact area, via which the active area may be electrically contacted in each case.

The first and second optoelectronic components may each contain a first contact area and also a second contact area, via which the active area may be electrically contacted in each case.

For example, the first contact areas of the first and second optoelectronic components and a common contact area may be arranged in the area of a light emission surface of the optoelectronic semiconductor device. The common contact area may, for example, be connected to the common conductive substrate via a via contact.

According to embodiments, an optoelectronic semiconductor device comprises an array of optoelectronic components, each of which has an identical layer structure. At least a portion of the optoelectronic components is suitable for acting as a surface-emitting diode laser, and at least another portion of the optoelectronic components is suitable for acting as a device which absorbs electromagnetic radiation.

According to further embodiments, a mobile device or an optical device contains the optoelectronic semiconductor device as described above.

The mobile device may be selected from a smartphone, a laptop, a tablet or a phablet.

The optical device may be selected from a distance measuring device, a 2D and/or 3D sensor or 2D and/or 3D scanner, an illumination device, a proximity sensor, a spectrometer or a reflective light barrier.

BRIEF DESCRIPTION OF THE DRAWINGS

The accompanying drawings serve to provide an understanding of non-limiting embodiments. The drawings illustrate non-limiting embodiments and, together with the description, serve to explain them. Further non-limiting embodiments and numerous intended advantages emerge directly from the following detailed description. The elements and structures shown in the drawings are not necessarily shown true to scale. Identical reference numerals refer to identical or corresponding elements and structures.

DETAILED DESCRIPTION

In the following detailed description, reference is made to the accompanying drawings, which form part of the disclosure, and in which specific exemplary embodiments are shown for purposes of illustration. In this context, directional terminology such as "top", "bottom", "front", "back", "over", "on", "in front of", "behind", "leading", "trailing", etc. refers to the orientation of the figures just described. Since the components of the exemplary embodiments may be positioned in different orientations, the directional terminology is only used for explanation and is not restrictive in any way.

The description of the exemplary embodiments is not restrictive, since also other exemplary embodiments exist and structural or logical changes may be made without deviating from the scope defined by the claims. In particular, elements of exemplary embodiments described in the following text may be combined with elements of other exemplary embodiments described, unless the context indicates otherwise.

The terms "wafer" and "semiconductor substrate" used in the following description may include any semiconductor-based structure that has a semiconductor surface. The wafer and structure are to be understood to include doped and undoped semiconductors, epitaxial semiconductor layers, possibly supported by a base, and further semiconductor structures. For example, a layer made of a first semiconductor material may be grown on a growth substrate made of a second semiconductor material or of an insulating material, for example, on a sapphire substrate. Depending on the intended use, the semiconductor may be based on a direct or an indirect semiconductor material. Examples of semiconductor materials particularly suited for generating electromagnetic radiation include, in particular, nitride semiconductor compounds which may, for example, generate ultraviolet, blue or longer-wave light such as GaN, InGaN, AlN, AlGaN, AlGaInN, phosphide semiconductor compounds, which may, for example, generate green or longer-wave light such as GaAsP, AlGaInP, GaP, AlGaP, as well as other semiconductor materials such as AlGaAs, SiC, ZnSe, GaAs, ZnO, $Ga_2O_3$, diamond, hexagonal BN, and combinations of the materials mentioned. The stoichiometric ratio of the ternary compounds may vary. Further examples of semiconductor materials may include silicon, silicon germanium, and germanium. In the context of the present description, the term "semiconductor" also includes organic semiconductor materials.

The terms "lateral" and "horizontal", as used in this description, are intended to describe an orientation or alignment which runs essentially parallel to a first surface of a substrate or semiconductor body. This may, for example, be the surface of a wafer or a chip (die).

The horizontal direction may, for example, lie in a plane perpendicular to a direction of growth when layers are grown on.

The term "vertical", as used in this description, is intended to describe an orientation which is essentially perpendicular to the first surface of a substrate or semiconductor body. The vertical direction may, for example, correspond to a direction of growth when layers are grown on.

To the extent that the terms "have", "contain", "comprise", "include" and the like are used herein, they are open-ended terms that indicate the presence of said elements or features, but do not rule out the presence of other elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Additional elements may be arranged between electrically connected elements.

Figure 1:
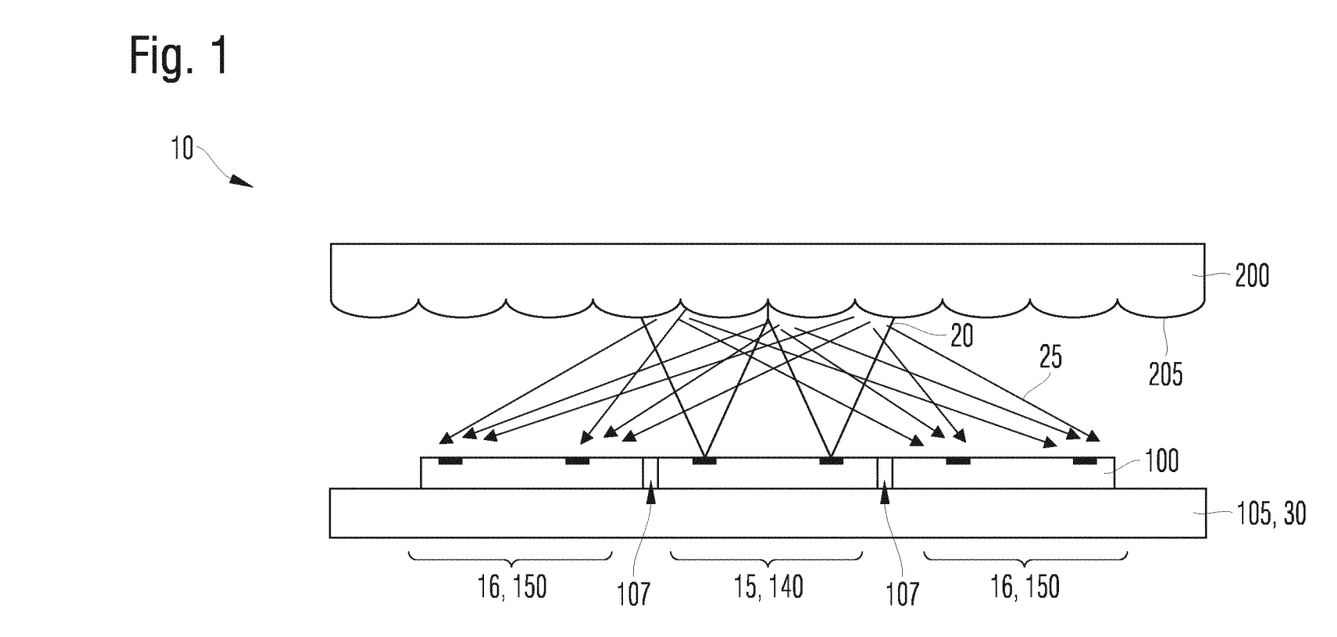
FIG. 1 shows a schematic illustration of an optoelectronic semiconductor device according to embodiments.

FIG. 1 shows an example of an optoelectronic semiconductor device 10 comprising a first array 140 of first optoelectronic components 15 and a second array 150 of second optoelectronic components 16. The first optoelectronic components 15 and the second optoelectronic components 16 are arranged in a common substrate 100. The common substrate 100 may, for example, be a monocrystalline semiconductor substrate on which semiconductor layers may be grown epitaxially. The exact structure of the particular optoelectronic components and of the substrate 100 is described below with reference to FIG. 2A. The first optoelectronic components 15 may, for example, be designed as surface-emitting laser diodes (VCSEL, "vertical-cavity surface-emitting laser"). The second optoelectronic components 16 may, for example, have a similar or identical layer structure to the first optoelectronic components 15. They may be interconnected in such a manner that they act as detectors. For example, the second optoelectronic components 16 may absorb the electromagnetic radiation 20 emitted by the first optoelectronic components 15, which radiation has, for example, been reflected by a reflective component. The substrate 100 may represent a common electrode of the first and second optoelectronic components 15, 16 in each case or may be connected to this common electrode. For example, a substrate area within the first array 140 may be insulated from a substrate area within the second array 150 by insulating elements 107. For example, such insulating elements 107 may be trenches which are filled with insulating, conductive or suitably doped semiconductor material. Depending on the interconnection of the optoelectronic components, the trenches may extend to different depths. For example, they may extend so deep that adjacent substrate areas may be isolated from one another. According to further embodiments, they may each extend into the substrate as deep as the individual optoelectronic components, as indicated for example in FIG. 5A. For example, both the first optoelectronic components 15 and the second optoelectronic components 16 may each be suitable for emitting or detecting electromagnetic radiation.

The substrate 100 may be applied to a suitable carrier 105. The carrier 105 may, for example, be part of a housing of a mobile device 30, an optical device 35 or a leadframe. The optoelectronic device 10 may further have an optical element 200. For example, the optical element 200 may be an array of microlenses 205. For example, the optical element 200 may be arranged above the first and above the second arrays 140, 150 of optoelectronic components. For example, the optical element 200 may completely cover both the first and the second arrays 140, 150 laterally along their direction of extension or overlap with them. For example, as illustrated in FIG. 1, radiation 20 emitted by the first optoelectronic components 15 may be reflected by the microlenses 205. The reflected radiation 25 is absorbed by the second optoelectronic components 16. An air gap may be arranged between the surface of the optoelectronic components 15, 16 and the optical element 200. According to further embodiments, an optically transparent material such as silicone or glass may be arranged between the surface of the optoelectronic components 15, 16 and the optical element 200. For example, the optical element 200 may be provided in order to reflect a portion of the radiation 20 emitted by the first optoelectronic components 15. For example, the radiation is reflected in the direction of the second optoelectronic components 16. These may absorb the reflected radiation 25 and determine based on a detected photocurrent whether, for example, the optical element 200 is properly attached to the mobile device.

Figure 2A:
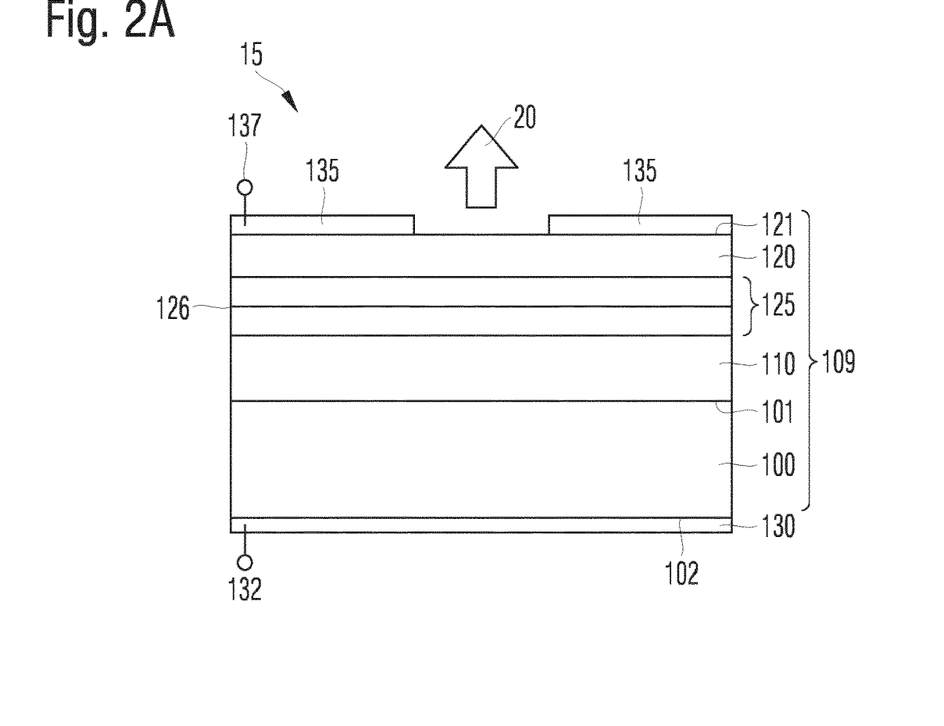
FIG. 2A shows a schematic cross-sectional view of part of a first optoelectronic component according to embodiments.

FIG. 2A shows a cross-sectional view of part of a first optoelectronic component according to embodiments. A first resonator mirror 120, an active area 125 suitable for generating radiation, and a second resonator mirror 110 are arranged over a first main surface 101 of a substrate. The first and second resonator mirrors 120, 110 may each have alternately stacked first layers of a first composition and second layers of a second composition. For example, the layers may alternately have a high refractive index (n>1.7) and a low refractive index (n<1.7) and be designed as a Bragg reflector. For example, the layer thickness may be $\lambda/4$ or a multiple of $\lambda/4$, where $\lambda$ indicates the wavelength of the light to be reflected. The first or second resonator mirror 120, 110 may, for example, have 2 to 50 different layers. A typical layer thickness of the individual layers may be around 30 to 90 nm, for example, around 50 nm. The layer stack may further contain one or two or more layers which are thicker than around 180 nm, for example, thicker than 200 nm. For example, the second resonator mirror 110 may have a total reflectivity of 99.8% or more for the laser radiation.

For example, the active area 125 may have an active layer 126 provided for generating radiation. The active layer 126 of the active area 125 may, for example, have a pn junction, a double heterostructure, a single quantum well (SQW) structure or a multi quantum well (MQW) structure for generating radiation. In this process, the term "quantum well structure" has no meaning with regard to the dimensionality of the quantization. Thus, it includes, among other things, quantum wells, quantum wires and quantum dots, as well as any combination of these layers. For example, the active area 125 may be based on a nitride, a phosphide or an arsenide compound semiconductor. For example, the substrate 100 may contain GaN, GaP or GaAs, and the active area 125 may, in each case, contain semiconductor materials which contain GaN, GaP or GaAs. Cladding layers, for example, made of n- or p-doped semiconductor layers, may adjoin the active layer 126. Overall, the layer thickness of the active area 125 is overall at least equal to the effective emitted wavelength ($\lambda/n$, where n corresponds to the refractive index of the active area), so that standing waves may form within the resonator. For example, a layer thickness of the active layer 126 is several 10's nm, and the layer thickness of the cladding layers may each be around 10 to 20 nm.

The second resonator mirror 110 is arranged between the active area 125 and the substrate 100. The first resonator mirror 120 and the second resonator mirror 110 form an optical resonator for the electromagnetic radiation 20 generated in the active area 125. For example, the first resonator mirror 120 and the second resonator mirror 110 are integrated together with the active area 125 in the semiconductor body 109 of the optoelectronic semiconductor device 10. The first resonator mirror 120 is designed as a decoupling mirror for the laser radiation generated in the resonator by means of induced emission and has, for example, a lower reflectivity than the second resonator mirror 110. Electromagnetic radiation 20 generated in the active area 125 is emitted in the vertical direction from the optoelectronic component. For example, the second resonator mirror 110 has a plurality of semiconductor layer pairs with, for example, each having a high difference in refractive index. The layers of the first resonator mirror 120 and the layers of the second resonator mirror 110 may, for example, be produced epitaxially. According to further embodiments, the first and/or the second resonator mirror may be constructed from dielectric layers.

For example, a second contact element 130 may be arranged adjacent to a second main surface 102 of the substrate. The second contact element 130 may be electrically connected to a second contact area 132 and to the second resonator mirror 110. Furthermore, a first contact element 135 may be arranged adjacent to a first main surface 121 of the first resonator mirror 120 and electrically connected to it. The first contact element 135 may, for example, be connected to a first contact area 137 of the first optoelectronic component. The first and second contact elements 130, 135 may, for example, contain an electrically conductive material. If the resonator mirrors are made of dielectric material, then the first contact element 135 and the second contact element 130 may each be electrically connected to the active area 125. For example, the first contact element 135 may be connected to the first cladding layer, for example, of the first conductivity type, of the active area 125. The second contact element 130 may be connected to the second cladding layer, for example, of the second conductivity type, of the active area 125.

The first optoelectronic component 15 represents a semiconductor laser that is electrically pumped, for example, via the first contact element 135 and the second contact element 130.

For example, the first contact element 135 may be recessed over a central area of the first optoelectronic component. For example, the first contact element 135 may run like a ring over an edge area of the first optoelectronic component. In this way, absorption of the emitted laser radiation in the first contact element 135 may be avoided or reduced.

According to embodiments, the layers of the first resonator mirror 120 may be doped with dopants of a first conductivity type, for example, p- or n-type. For example, the layers of the second resonator mirror 110 may be doped with a second conductivity type, for example, n-type or p-type. According to further embodiments, only selected layers of the layer sequence of the resonator mirrors 110, 120 may be doped accordingly. The substrate 100 may be doped, for example, with dopants of the second conductivity type.

Figure 2B:
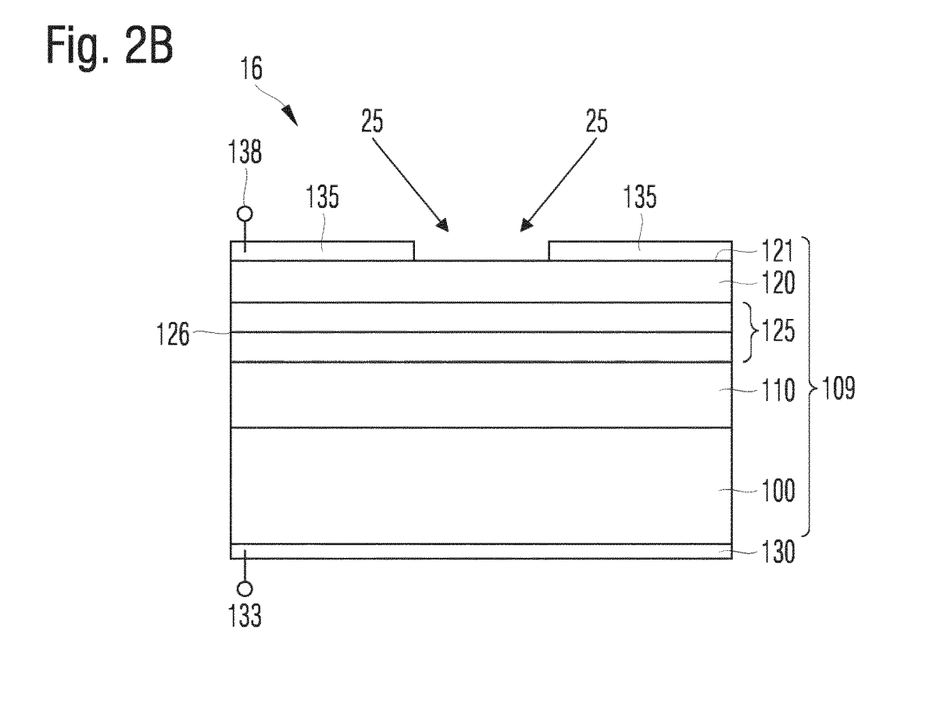
FIG. 2B shows a schematic cross-sectional view of part of a second optoelectronic component according to further embodiments.

FIG. 2B shows a schematic cross-sectional view of an example of a second optoelectronic component 16. According to embodiments, the second optoelectronic component 16 may have the same layer structure as the first optoelectronic component 15.

According to further embodiments, certain areas may be designed differently. For example, the first and second resonator mirrors may be omitted, and the second optoelectronic component 16 only has the active area 125. For example, the active area 125 of the second optoelectronic component 16 may be formed identically to the active area 125 of the first optoelectronic component 15.

The second optoelectronic component 16 is suitable for absorbing electromagnetic radiation 25. For example, this may be achieved in that the first contact element 135 and the second contact element 130 are connected to potentials in a suitable manner, that the second optoelectronic component 16 is operated in the reverse direction. The first contact element 135 is connected to a first contact area 138. The second contact element 130 is connected to a second contact area 133 of the second optoelectronic component. For example, the first contact area 137 of the first optoelectronic component may be connected to the second contact area 133 of the second optoelectronic component. According to further embodiments, the second contact area 132 of the first optoelectronic component 15 may also be connected to the first contact area 133 of the second optoelectronic component 16. Furthermore, it is conceivable that the first contact area 137 of the first optoelectronic component is connected to the first contact area 138 of the second optoelectronic component. In addition, the second contact area 132 of the first optoelectronic semiconductor component may be connected to the second contact area 133 of the second optoelectronic semiconductor component.

Figure 2C:
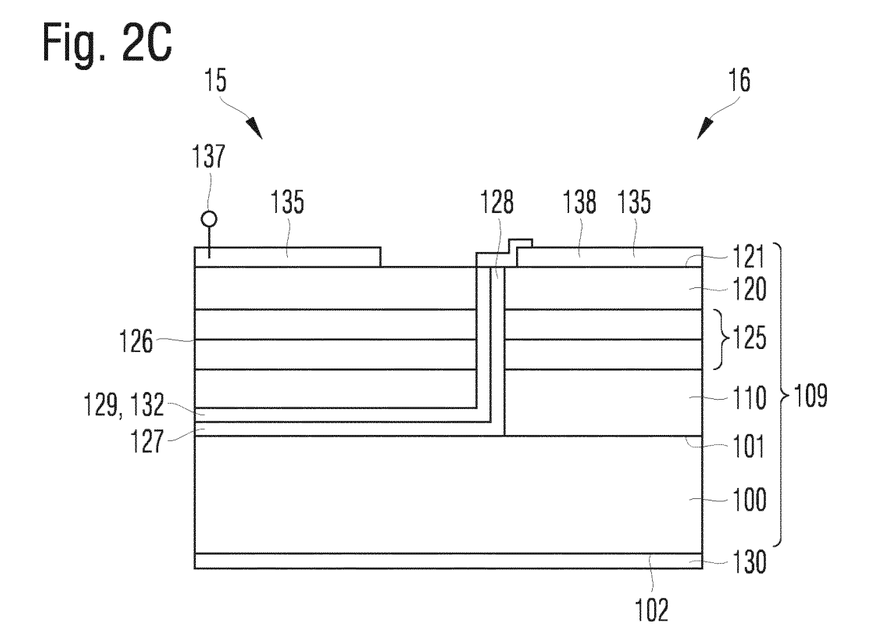
FIG. 2C shows a transition area between the first and second optical elements according to embodiments.

FIG. 2C shows a connection area between a first optoelectronic component 15 and a second optoelectronic component 16 according to embodiments. For example, an insulating layer 127 and a conductive material 129 may be introduced between the second resonator mirror 110 and the substrate 100 in the area of the first optoelectronic component 15. In this way, the layer stack with the second resonator mirror is electrically connected to the conductive material 129. The conductive material 129 is, as further illustrated in FIG. 2C, guided onto the surface of the layer stack or semiconductor body 109 and electrically connected to the first contact element 135 of the second optoelectronic component 16. In this way, the second contact area 132 of the first optoelectronic component 15 may, for example, be connected to the first contact area 138 of the second optoelectronic component 16. As is to be clearly understood, the first and second optoelectronic components are also interchangeable. In this way, it is possible to connect the second contact area 133 of the second optoelectronic component to the first contact area 137 of the first optoelectronic component 15.

Figure 2D:
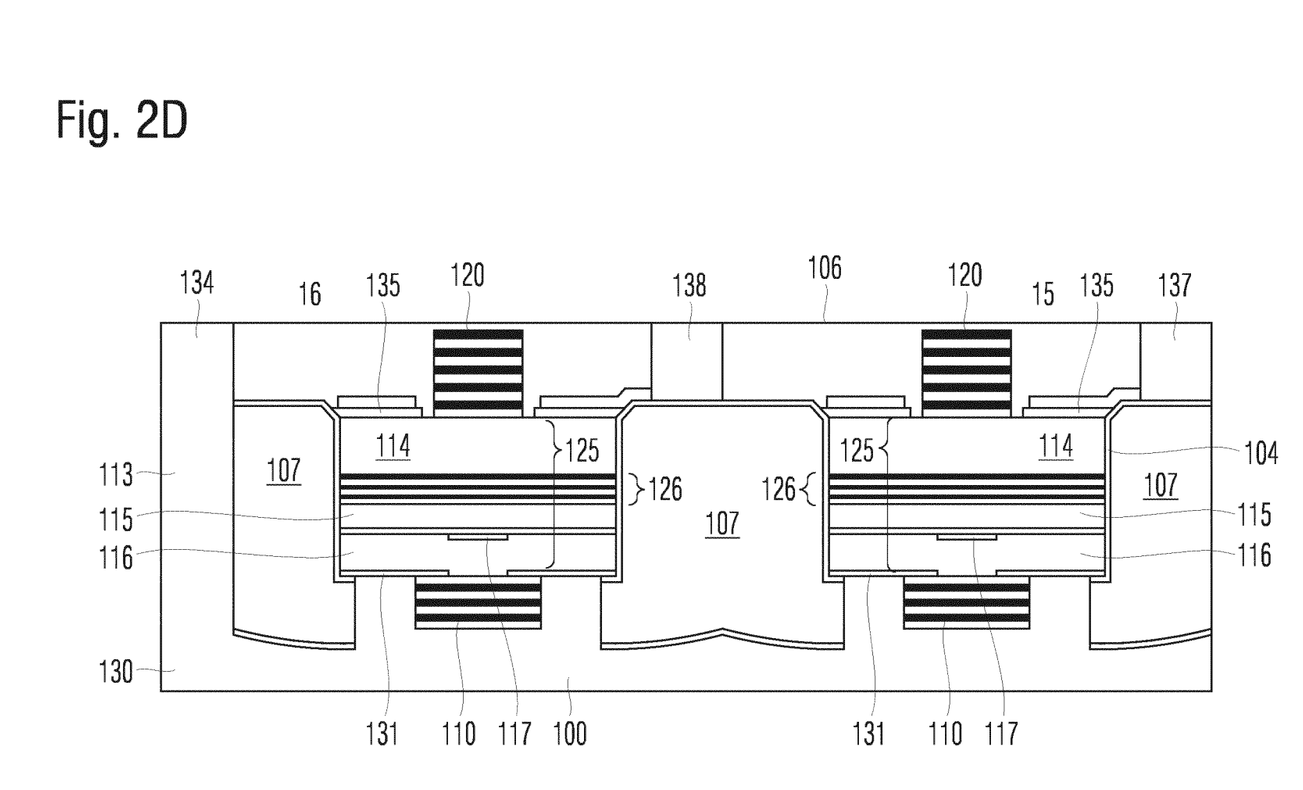
FIG. 2D shows a schematic cross-sectional view of an optoelectronic semiconductor device according to embodiments.

FIG. 2D shows a cross-sectional view of an optoelectronic semiconductor device 10 according to further embodiments. According to these embodiments, the optoelectronic semiconductor device 10 may be designed as a flip-chip component. The optoelectronic semiconductor device 10 includes a first optoelectronic component 15 and a second optoelectronic component 16, which are formed on a common substrate 100. The first and second optoelectronic components are each formed similarly to the components shown in FIGS. 2A and 2B. However, the second contact element 130 is connected, via a via contact 113, to a common contact area 134, which is arranged in the area of a light emission surface 106 of the optoelectronic semiconductor device 10. In this way, the optoelectronic semiconductor device 10 is exclusively arranged, via contact areas 134, 137, 138, in the area of the light emission surface 106 of the optoelectronic semiconductor device 10. The generated electromagnetic radiation is emitted via the light emission surface 106. For example, the via contact 113 extends from the common substrate 100 to a light emission surface 106 of the optoelectronic semiconductor device 10.

The optoelectronic components comprise a first and second cladding layers 114, 115. An active layer 126, which may, for example, contain a multi quantum well structure is arranged between the first and second cladding layers. The active area 125 may, in addition, have a third cladding layer 116 and an opening (aperture) 117 in each case. The insulating elements 107 may further be isolated from the active area by an insulating material 104 which, for example, contains silicon oxide. The common substrate 100 may be conductive or coated with a conductive material. The active area 125 may, in each case, be connected to the associated contact areas 137, 138 of the first or second optoelectronic component via first contact elements 135. The active area 125 may further be connected to the second contact element 130 via a contact layer 131.

Figure 2E:
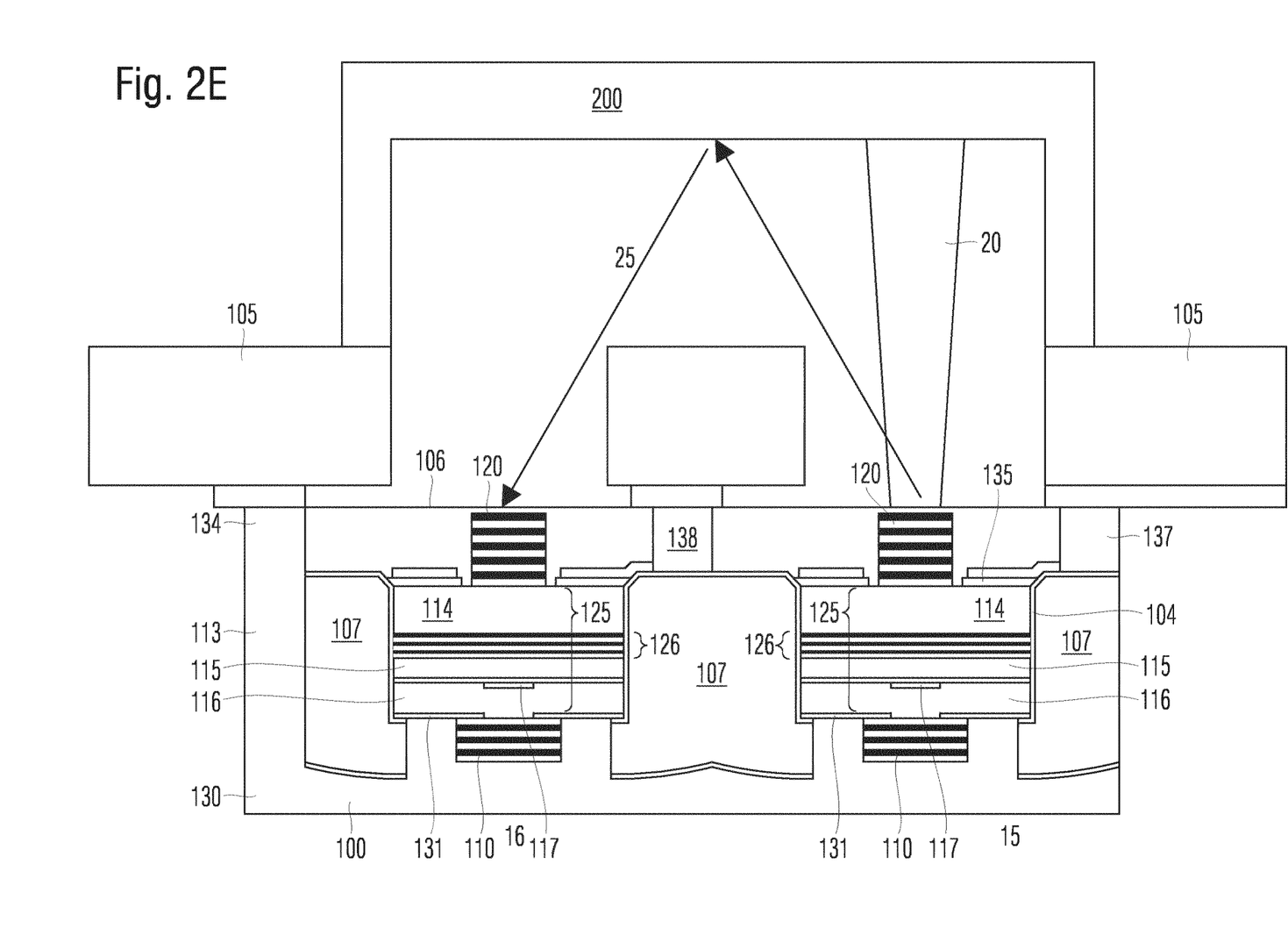
FIG. 2E shows a schematic cross-sectional view of an optoelectronic semiconductor device according to further embodiments.

FIG. 2E shows the optoelectronic semiconductor device 10 shown in FIG. 2D by way of example, which is mounted on a suitable carrier 105, for example, a circuit board or a housing. Radiation 20 emitted by the first optoelectronic component 15 may be reflected by the optical element 200 and absorbed or received by the second optoelectronic component. For example, conductor tracks may be provided in the carrier 105 so that a corresponding voltage may be applied to the contact areas of the first and second optoelectronic components.

According to an alternative interpretation, an optoelectronic semiconductor device 10 comprises an array of optoelectronic components 15, 16, each of which has an identical layer structure. At least a portion of the optoelectronic components 15 is suitable for acting as a surface-emitting diode laser, and at least another portion of the optoelectronic components 16 is suitable for acting as a device which absorbs electromagnetic radiation.

Figure 3A:
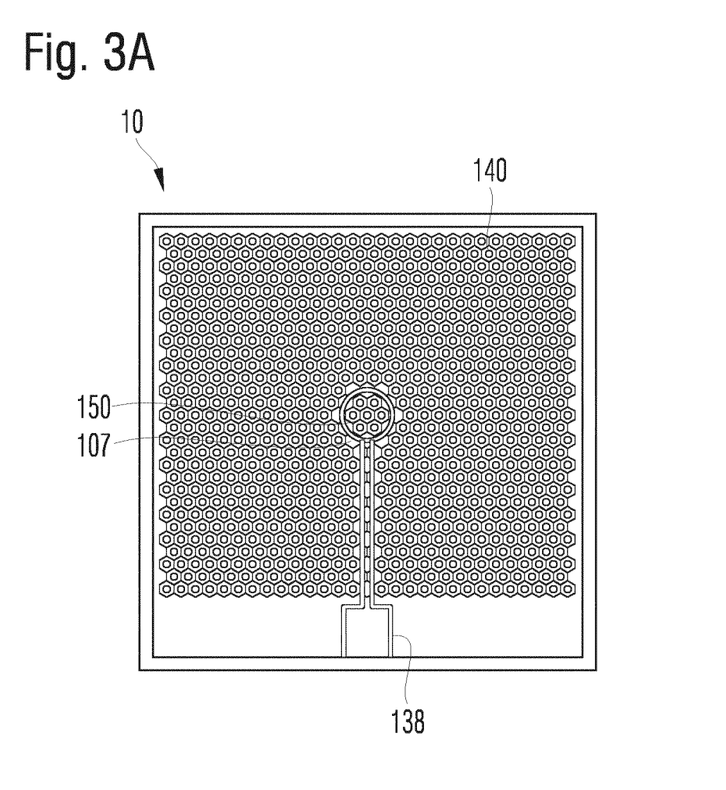
FIG. 3A shows a schematic plan view of an optoelectronic semiconductor device according to embodiments.

FIG. 3A shows a plan view of an optoelectronic semiconductor device according to embodiments. As can be seen, the optoelectronic semiconductor device has a first array 140 of first optoelectronic components 15. A second array 150 of second optoelectronic components 16 is arranged in the central area of the array. The second array 150 is spatially separated by insulating elements 107, so that, for example, the first contact element 135 of the first optoelectronic component 15 is isolated from the first contact element 135 of the second optoelectronic component 16 in each case. For example, the first contact elements 135 of the second optoelectronic component 16 may be connected to a first contact area 138 which is arranged at the edge of the optoelectronic device. As further illustrated in FIG. 3A, the second array 150 has a significantly smaller surface than the first array 140. For example, the second array 150 may comprise less than 20, for example, less than 10, second optoelectronic components 16. A large portion of the first array 140 may, for example, be used as a light source for applications, while the small area 150 is used as a photodetector.

If the electromagnetic radiation emitted by the first optoelectronic components 15 is reflected by the optical element 200, which is shown in FIG. 1, a photocurrent may be generated in the second optoelectronic components. This photocurrent may be used to check that the optical element 200 is still properly attached. According to further embodiments, the optoelectronic device may also be operated in a pulsed mode using a time-division multiplex method. In this case, light may briefly be emitted through the first area 140, and the second array may be switched as a photodiode in the other time sections. In this case, for example, the second array may have a larger surface than the first array.

Figure 3B:
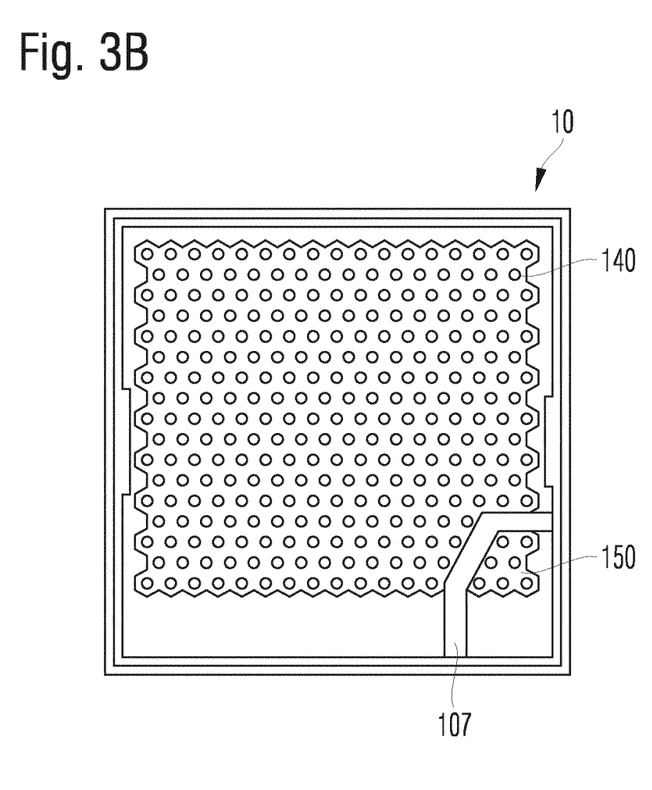
FIG. 3B shows a schematic plan view of an optoelectronic semiconductor device according to further embodiments.

FIG. 3B shows a further possible design of the optoelectronic semiconductor device 10. Unlike as shown in FIG. 3A, the second array 150 is here arranged in an edge area. Correspondingly, the second array 150 may, for example, only adjoin the first array 140 on one or two sides. According to the arrangement shown in FIG. 3A, the second area 150 may, for example, almost completely be surrounded by the first array 140.

Figure 3C:
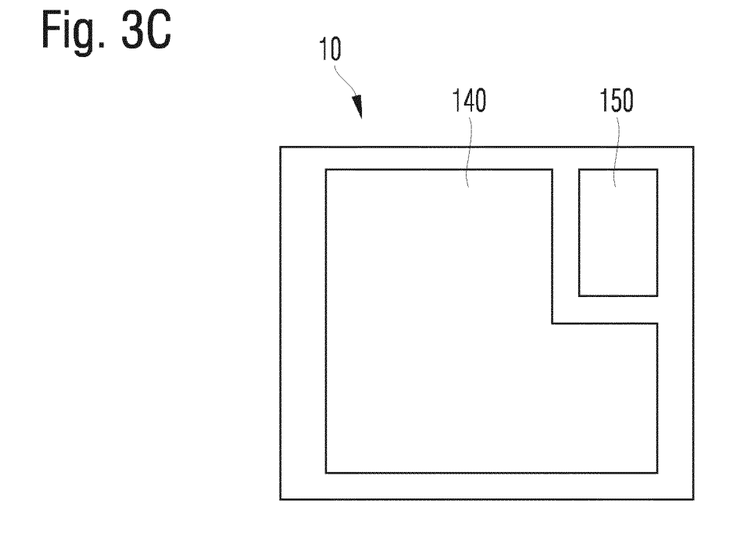
FIG. 3C shows a schematic plan view of an optoelectronic semiconductor device according to further embodiments.

FIG. 3C shows a schematic illustration in which the second array 150 adjoins the first array 140 on two sides.

Figure 4A:
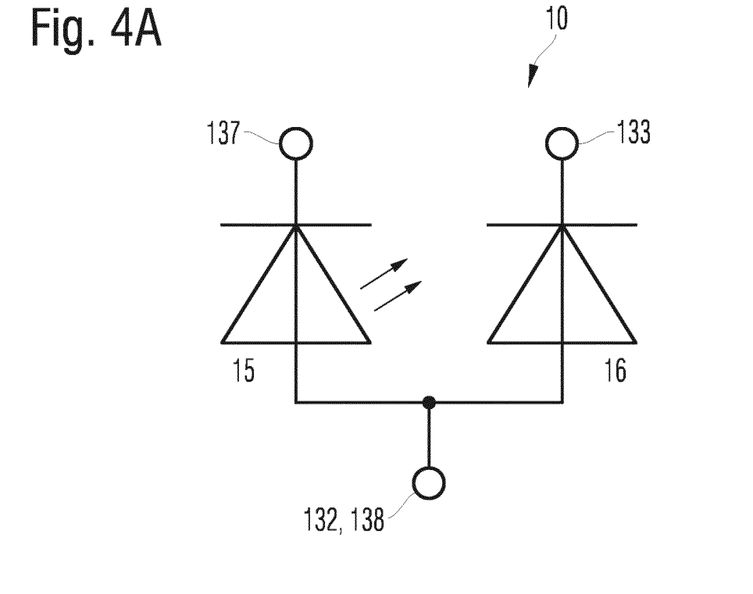
FIG. 4A shows a circuit diagram of the optoelectronic device according to embodiments.

FIG. 4A shows a circuit diagram of the optoelectronic device according to embodiments. As can be seen, the second contact area 132 of the first optoelectronic component 15 is short-circuited to the first contact area 138 of the second optoelectronic component 16. Furthermore, the first optoelectronic component 15 is operated in the forward direction, while the second optoelectronic component 16 is connected upstream in the reverse direction.

Figure 4B:
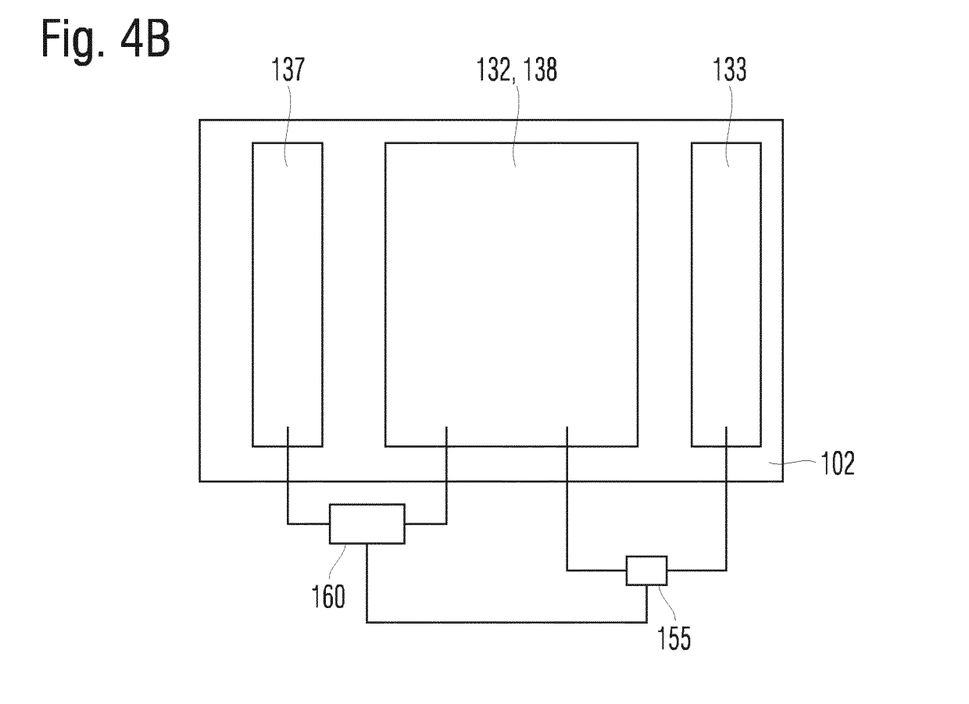
FIG. 4B shows a schematic plan view of a second main surface of an optoelectronic semiconductor device according to embodiments.

FIG. 4B shows a schematic plan view of a second main surface 102 of the substrate 100. As can be seen, the second contact area 132 of the first optoelectronic component 15 and the first contact area 138 of the second optoelectronic component 16 are connected to one another by a common electrode. The first contact area 137 of the first optoelectronic component is isolated from this common connection. Furthermore, the second contact area 133 of the second optoelectronic component 16 is isolated from the common connection. A photocurrent generated in the second optoelectronic component 16 may, as is further illustrated in FIG. 4B, also be measured by the measuring device 155 in order to determine whether the optical element 200 is attached as intended and reflects light. As soon as it is detected that the photocurrent falls below a prescribed threshold, the optoelectronic device 10 may be switched off by the control device 160. The level of the detected photocurrent may, for example, depend on the size of the second array 150, that is to say, for example, on the number of second optoelectronic components 16 within the second array 150.

Figure 4C:
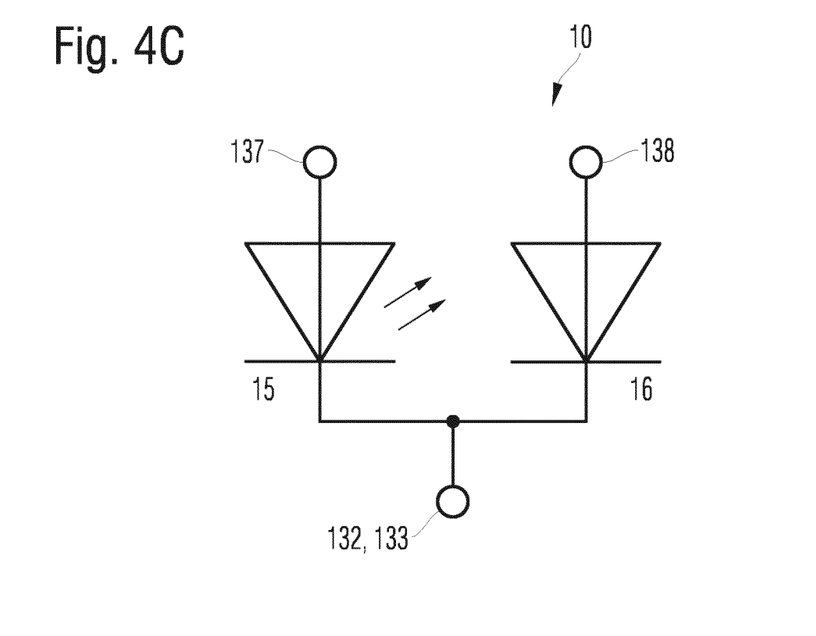
FIG. 4C shows a circuit diagram of the optoelectronic device according to further embodiments.

FIG. 4C shows a circuit diagram of the optoelectronic device according to further embodiments. As can be seen, the second contact area 132 of the first optoelectronic component 15 is short-circuited to the second contact area 133 of the second optoelectronic component 16. Furthermore, the first optoelectronic component 15 is operated in the forward direction, while the second optoelectronic component 16 is connected upstream in the reverse direction.

Figure 5A:
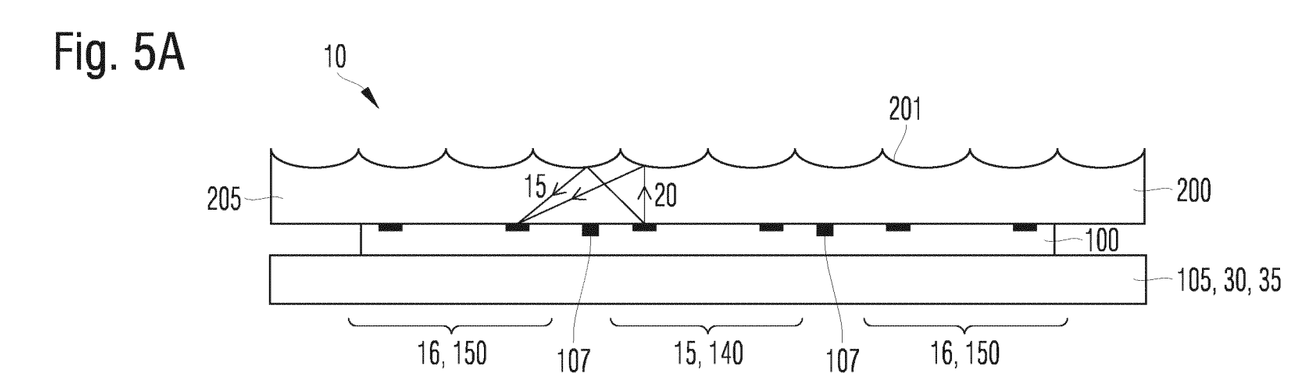
FIG. 5A shows a cross-sectional view of an optoelectronic semiconductor device according to further embodiments.

FIG. 5A shows an optoelectronic device 10 in which the optical element 200 directly adjoins the array of first and second optoelectronic components. For example, the optical element 200 may directly adjoin the first contact element 135. For example, concave areas of the array of microlenses 205 may be arranged on the side of the optical element facing away from the substrate 100. In this case, the electromagnetic radiation emitted by the first optoelectronic components is reflected on the first main surface 201 of the optical element 200. The other elements of FIG. 5A are as described with reference to FIG. 1. According to FIG. 5A, the isolation trenches may only extend upwards to an extension depth of the optoelectronic components. The arrangement shown in FIG. 5A is particularly compact.

Figure 5B:
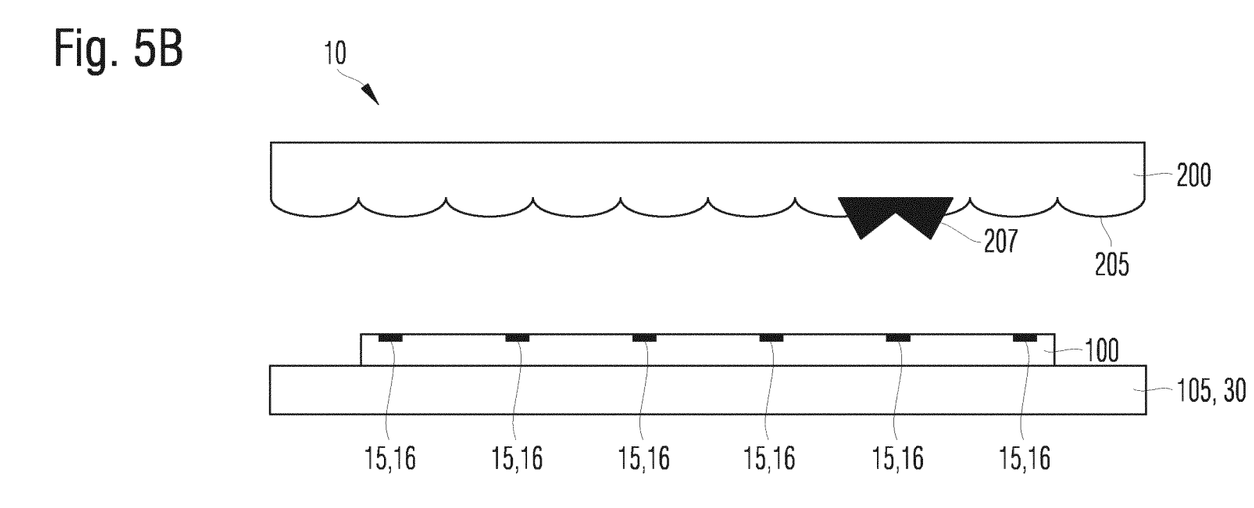
FIG. 5B shows a cross-sectional view of an optoelectronic semiconductor device according to further embodiments.

According to embodiments shown in FIG. 5B, the optoelectronic device 10 may further include a deflection element 207, which may be built into the optical element 200. For example, a plurality of deflection elements 207 may be built or integrated into the optical element 200. These deflection elements may, for example, have two totally reflective surfaces inclined to one another. These may be arranged in such a manner that light beams from parts of the first array 140 consisting of first optoelectronic components 15 are purposefully guided onto the second array 150 of second optoelectronic components 16. In this way, the photocurrent may be increased or the size of the second array 150 may be reduced while the photocurrent remains approximately the same.

The described arrangement makes the size of the optoelectronic semiconductor device more compact. An optoelectronic semiconductor device is described in which it is possible to emit electromagnetic radiation and, for example, measure light reflected by the optical element, and which may be constructed in a particularly compact design. Furthermore, the wiring of the corresponding connections may be implemented in a simple manner without special wiring elements. Furthermore, first and second optoelectronic components may be produced by common manufacturing processes, which makes the device inexpensive.

Figure 6A:
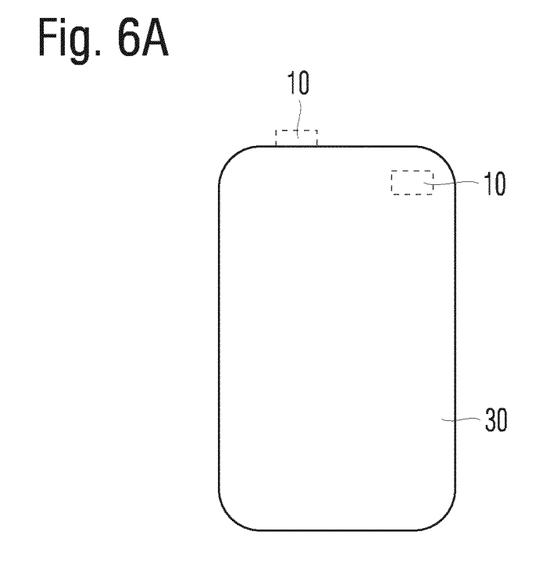
FIG. 6A shows a schematic view of a mobile device.

FIG. 6A shows a mobile device 30 with the optoelectronic device 10 described. The mobile device 30 may, for example, be a notebook, a smartphone, a tablet or another device that, for example, is suitable for mobile communication. For example, the laser light source of the first array 140 comprising the first optoelectronic components 15 may be used for applications of the mobile device 30 such as distance measurement and others.

Figure 6B:
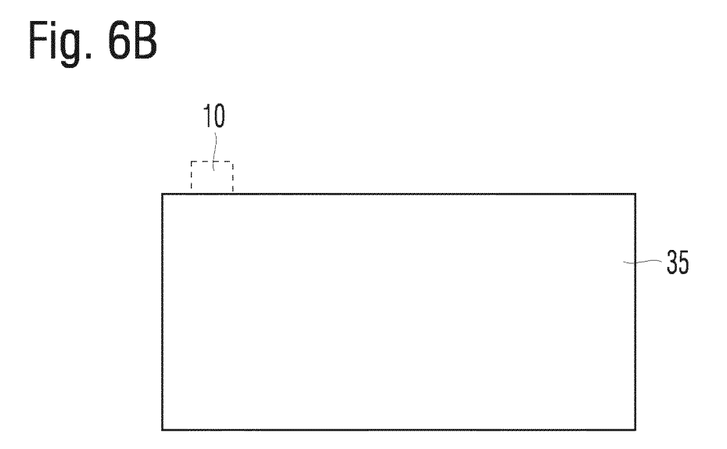
FIG. 6B shows a schematic view of an optical device.

FIG. 6B shows an optical device 35 with the optoelectronic device 10 according to embodiments. For example, the laser light source of the first array 140 with first optoelectronic components 15 may perform numerous functions of the optical device 35. Examples include distance measurement, 2D and/or 3D sensing/scanning, lighting, proximity sensors, spectrometry, retro-reflective photoelectric sensors and others. The optical device may be part of a larger component, for example, for automotive applications, smart home applications, industrial applications and others.

In general, there is a risk with devices of this type that the optical element 200 shown, for example, in FIGS. 1, 5A and 5B will become detached and that the laser radiation may directly damage the user. Detachment of the optical element 200 may be monitored by the optoelectronic device described without the need to increase the size of the mobile device 30 or of the optical device or provide complex wiring. As a result, eye safety may be increased in a mobile device.

Although specific embodiments have been illustrated and described herein, persons skilled in the art will recognize that the specific embodiments shown and described may be replaced by a multitude of alternative and/or equivalent embodiments without departing from the scope of the invention. The application is intended to cover any adaptations or variations of the specific embodiments discussed herein. Therefore, the invention is to be limited only by the claims and their equivalents.

LIST OF REFERENCES 10 optoelectronic semiconductor device
15 first optoelectronic component 16 second optoelectronic component
20 emitted radiation
25 radiation to be absorbed
30 mobile device
35 optical device
100 substrate
101 first main surface of the substrate
102 second main surface of the substrate
104 insulating material
105 carrier
106 light emission surface
107 insulating element
109 semiconductor body
110 second resonator mirror
113 via contact
114 first cladding layer
115 second cladding layer
116 third cladding layer
117 opening
120 first resonator mirror
121 first main surface of the first resonator mirror
125 active area
126 active layer
127 insulating layer
128 sidewall insulation
129 conductive layer
130 second contact element
131 contact layer
132 second contact area of the first optoelectronic component
133 second contact area of the second optoelectronic component
134 common contact area
135 first contact element
137 first contact area of the first optoelectronic component
138 first contact area of the second optoelectronic component
140 first array
150 second array
155 measuring device
160 control device
200 optical element
201 first main surface of the optical element
205 microlens
207 deflection element

The invention claimed is:

1. An optoelectronic semiconductor device comprising:
a housing;
an optical element attached to the housing;
a first array of first optoelectronic components; and
a second array of second optoelectronic components arranged in a substrate attached to the housing, wherein the optical element is arranged above the first array and the second array,
wherein each of the first optoelectronic components includes a first resonator mirror, an active area configured to generate electromagnetic radiation and a second resonator mirror; wherein the first resonator mirror comprises a first main surface, wherein electromagnetic radiation emitted by each of the first optoelectronic components is configured to be emitted via the first main surface;
wherein the optical element is configured to reflect the electromagnetic radiation emitted by the first optoelectronic components; and
wherein each of the second optoelectronic components comprises an active area suitable for generating electromagnetic radiation and are configured to absorb the electromagnetic radiation reflected by the optical element.

2. The optoelectronic semiconductor device according to claim 1, wherein the first optoelectronic components form surface-emitting laser diodes.

3. The optoelectronic semiconductor device according to claim 1, wherein the active area of each of the first optoelectronic components is identical to the active area of each of the second optoelectronic components.

4. The optoelectronic semiconductor device according to claim 1, wherein the first array has a larger surface area than the second array.

5. The optoelectronic semiconductor device according to claim 4, wherein the second array is arranged in a central area within the first array.

6. The optoelectronic semiconductor device according to claim 4, wherein the second array is arranged in an edge area of the first array.

7. The optoelectronic semiconductor device according to claim 1, wherein the optical element is an array of microlenses.

8. The optoelectronic semiconductor device according to claim 7, wherein the optical element contains additional deflection elements configured to direct incident radiation onto a predetermined area of the second array.

9. The optoelectronic semiconductor device according to claim 1, wherein the optical element directly adjoins a surface of the optoelectronic components.

10. The optoelectronic semiconductor device according to claim 1, wherein the second optoelectronic components are configured to detect electromagnetic radiation emitted by the first optoelectronic components.

11. The optoelectronic semiconductor device according to claim 1, wherein each of the first optoelectronic components is electrically connected to one another via at least a portion of the substrate.

12. The optoelectronic semiconductor device according to claim 1, wherein each of the second optoelectronic components is electrically connected to one another via at least a portion of the substrate.

13. The optoelectronic semiconductor device according to claim 1, further comprising an insulating element configured to insulate the first array from the second array.

14. The optoelectronic semiconductor device according to claim 1, wherein each of the first and second optoelectronic components includes a first contact area and also a second contact area, respectively, via which the active area is configured to be electrically contacted in each case.

15. The optoelectronic semiconductor device according to claim 14, wherein the first contact areas of the first and second optoelectronic components and a common contact area are arranged in the area of a light emission surface of the optoelectronic semiconductor device.

16. A mobile device or an optical device comprising the optoelectronic semiconductor device according to claim 1.

17. The mobile device according to claim 16 selected from a smartphone, a laptop, a tablet, or a phablet.

18. An optical device according to claim 16 selected from a distance measuring device, a 2D and/or 3D sensor or 2D and/or 3D scanner, a lighting device, a proximity sensor, a spectrometer, or a reflection light barrier.

19. The optoelectronic semiconductor device according to claim 1, which is configured to generate a photocurrent in the second optoelectronic semiconductor components, which photocurrent is usable for monitoring a position of the optical element.

\* \* \* \* \*